United States Patent
Chen et al.

(10) Patent No.: US 6,809,028 B2
(45) Date of Patent: Oct. 26, 2004

(54) CHEMISTRY FOR LINER REMOVAL IN A DUAL DAMASCENE PROCESS

(75) Inventors: Chao-Cheng Chen, Matou (TW); Chien-Chung Fu, Shan Chung (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 3 days.

(21) Appl. No.: 10/282,386

(22) Filed: Oct. 29, 2002

(65) Prior Publication Data

US 2004/0082164 A1 Apr. 29, 2004

(51) Int. Cl.⁷ .......................................... H01L 21/4763
(52) U.S. Cl. ........................ 438/637; 438/640; 438/624
(58) Field of Search ............................... 438/637, 640, 438/624, 638, 623, 701

(56) References Cited

U.S. PATENT DOCUMENTS 5,310,454 A * 5/1994 Ohiwa et al. ............... 438/723
6,333,258 B1 * 12/2001 Miyata et al. ............... 438/637

OTHER PUBLICATIONS

Thanawala et al, "Reduction in the Effective Dielectric Constant of Integrated Interconnect Structures through an All–Spin–on Strategy" http://www.advanced–polymers.com/star_center/technical_papers/reduction_in_effective_dielectric_constant.pdf.*

* cited by examiner

Primary Examiner—Carl Whitehead, Jr.
Assistant Examiner—Laura M Schillinger
(74) Attorney, Agent, or Firm—Haynes and Boone, LLP

(57) ABSTRACT

An improved and new process for fabricating dual damascene copper, in which trench/via liner removal from porous low-k dielectric, is performed using a new RIE chemistry of $CF_4/H_2$, to etch SiN and SiC liners. Prior to the new process, convention liner etching produced the following deleterious results: a) Cu re-deposition by sputtering, b) polymer deposits, and c) surface roughening of the porous low-k IMD dielectric. Process details are: $CF_4/H_2$ based with approximate gas flow ratios of greater than 10 to 1, hydrogen to carbon tetra-fluoride. A nominal flow ratio of 300 to 20, hydrogen to carbon tetra-fluoride, or 15 to 1, was developed.

7 Claims, 4 Drawing Sheets

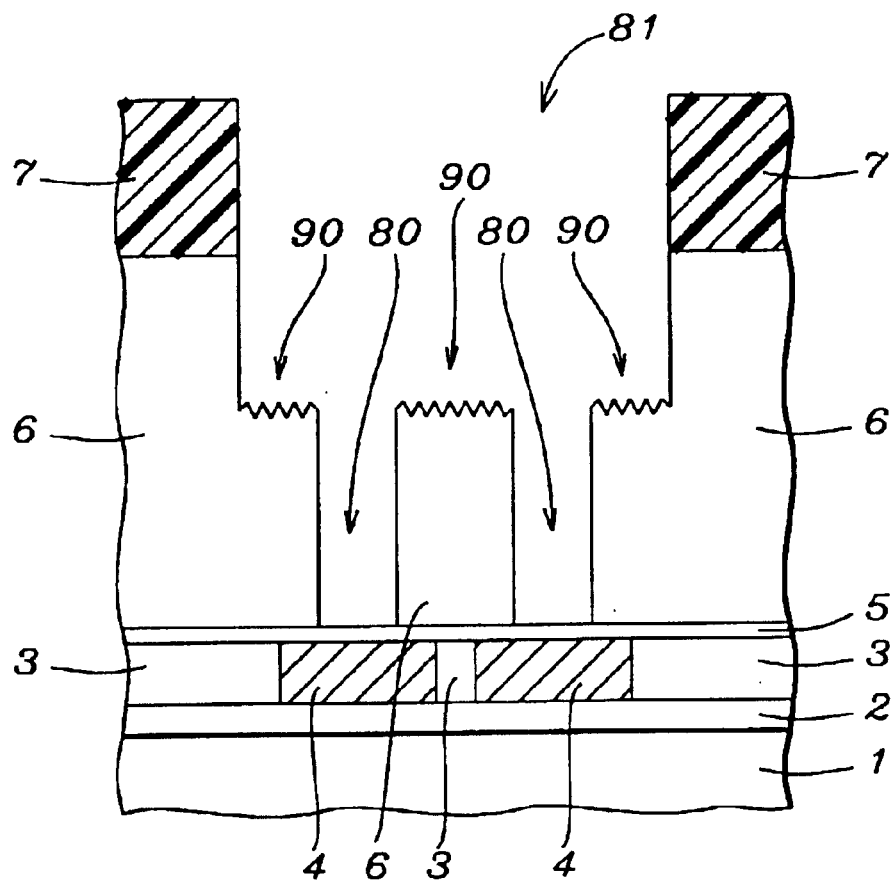
*FIG. 1 – Prior Art*
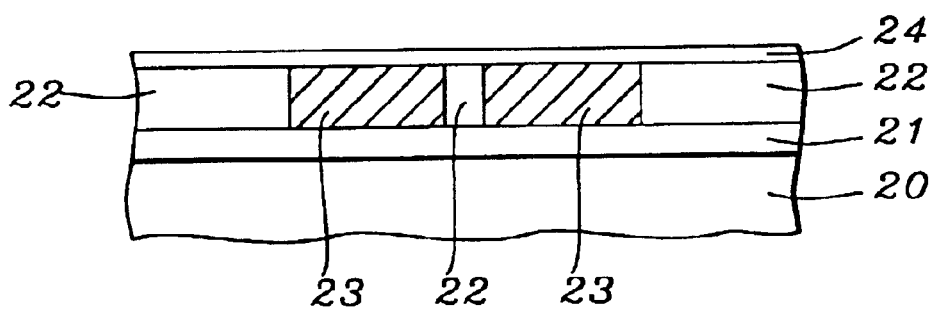
*FIG. 2A*

CHEMISTRY FOR LINER REMOVAL IN A DUAL DAMASCENE PROCESS

BACKGROUND OF THE INVENTION (1) Field of the Invention

This invention relates to a method of fabrication used for semiconductor integrated circuit devices, and more specifically to fabricating dual damascene copper, in which trench/via liner removal from porous low-k dielectric, is performed using a new etch chemistry of $CF_4/H_2$, to etch SiN and SiC liners.

(2) Description of Related Art

In this section a description of related Prior Art background patents follows.

U.S. Pat. No. 6,255,226 B1 entitled "Optimized Metal Etch Process To Enable The Use of Aluminum Plugs" granted Jul. 3, 2001 to Zheng et al. shows a metal and barrier layer etch using a fluorine containing gas. A process for manufacturing a semiconductor device having metal interconnects reduces or eliminates the recessing of metal in the vias, particularly when the metal in the vias is aluminum or an aluminum alloy. By manipulating the etch chemistry so that the etch rates of the aluminum alloy, the surrounding barrier metals, and the dielectric are comparable, it is possible to perform the metal over etch without forming voids in the exposed portion of the via. By eliminating the voids, thinning of the vias due to the presence of recesses is minimized.

U.S. Pat. No. 6,228,775 B1 entitled "Plasma Etching Method Using Low Ionization Potential Gas" granted May 8, 2001 to Coburn et al. discloses a CF oxide etch. The etching method for forming an opening includes providing a substrate assembly having a surface and an oxide layer thereon. A patterned mask layer is provided over the oxide layer exposing a portion of the oxide layer. A plasma including one or more of CHF ions and CF ions and further including xenon or krypton ions is used to etch the oxide layer at the exposed portion to define the opening in the oxide layer while simultaneously depositing a polymeric residue on a surface defining the opening. The etching is continued until the opening in the oxide layer is selectively etched to the surface of the substrate assembly.

U.S. Pat. No. 6,159,862 entitled "Semiconductor Processing Method And System Using $C_5F_8$" granted Dec. 12, 2000 to Yamada et al. discloses a method and system for a CF dielectric etch. When processing oxides and dielectrics in a gas plasma processing system, $C_5F_8$ is used in combination with a carrier gas (e.g., Ar) and one or more of CO and oxygen. When using a silicon nitride layer as an etch stop, effective etching is performed due to the selectivity of oxides versus silicon nitride. The method is used when etching down to self-aligning contacts and other layers. The method may be practiced with or without using an anti-reflective coating underneath the photoresist layer.

U.S. Pat. No. 6,265,779 B1 entitled "Method And Material For Integration Of Fluorine-Containing Low-K Dielectrics" granted Jul. 24, 2001 to Grill et al. reveals a dual damascene process with liners. Metal and insulator interconnect structures are described incorporating one or more layers of fluorinated dielectric insulation, one or more conductive wiring levels interconnected by vias and capping and/or liner materials to physically isolate the wiring levels and vias from the fluorinated dielectric such as fluorinated diamond like carbon which has a low dielectric constant.

The invention overcomes the problem that can arise when fluorine in the fluorinated dielectric insulation reacts with other materials in the interconnect structure to produce unwanted fluorine-containing compounds that can interfere with the structure's mechanical integrity or interconnect function.

SUMMARY OF THE INVENTION

It is a general object of the present invention to provide an improved method for fabricating dual damascene copper, in which trench/via liner, or etch stop, removal from porous low-k dielectric, is performed using a new etch chemistry of $CF_4/H_2$, to etch SiN and SiC liners. Prior to this new process, convention liner etching produced the following deleterious results:

a) Cu re-deposition by sputtering, b) polymer deposits, and c) surface roughening of the porous low-k IMD dielectric. Process details are: $CF_4/H_2$ based with approximate gas flow ratios of greater than 10 to 1, hydrogen to carbon tetra-fluoride. A nominal flow ratio of 300 to 20, hydrogen to carbon tetra-fluoride, or 15 to 1, was developed.

The key aspects of the present invention are as follows: a layer of photoresist is formed over an insulating layer, so as to expose trench opening, via openings and etch stop regions. The new etchant of the present invention, is applied in a reactive ion etch chamber for the sole purpose of removing the exposed etch stop layer, or trench/via liner, and thereby, exposing the underlying copper interconnection wiring. The trench/via liner, or exposed etch stop, is removed from a porous low-k dielectric environment, using a new etch chemistry of $CF_4/H_2$, to etch the SiN and SiC liners, which are used as dual damascene etch stops. Process details are: $CF_4/H_2$ based with approximate gas flow ratios of greater than 10 to 1, hydrogen to carbon tetra-fluoride. A nominal gas flow ratio of 300 to 20, hydrogen gas to carbon tetra-fluoride gas, which reduces to a ratio of 15 to 1, was developed. The $CF_4/H_2$ based, RIE, reactive ion etch process yields good etch stop removal, in a reducing atmosphere with HF generation, with smooth shiny copper without CuO, and a smooth intermetal dielectric surfaces, and that does not need any subsequent solvent processing steps. The present invention applies to porous low dielectric constant dielectric insulators with dielectric constants less than 2.5 selected from the group comprised of several Japanese company products, JSR: LKD-5109, 2 Dou, Xerogel, Trikon: Orion, and other porous, low dielectric constant insulators. The other applicable materials are comprised of low dielectric constant porous materials selected from the group comprised of: SiN, SiO, SOG, which is spun-on-glass, PE plasma enhanced TEOS, which is tetraethoxysilane, halogenated SiO, and fluorinated silicate glass. All the materials above are deposited by a chemical vapor deposition process or a spin-on process.

This invention has been summarized above and described with reference to the preferred embodiments. Some processing details have been omitted and are understood by those skilled in the art. More details of this invention are stated in the "DESCRIPTION OF THE PREFERRED EMBODIMENTS" section.

BRIEF DESCRIPTION OF THE DRAWINGS

The object and other advantages of this invention are best described in the preferred embodiments with reference to the attached drawings that include:

FIG. 1, which in cross-sectional representation illustrate the method of Prior Art, "conventional" dual damascene processing.

FIGS. 2A–F which in cross-sectional representation illustrate the method of the present invention, in a dual damascene process.

DESCRIPTION OF THE PREFERRED EMBODIMENTS

Figure 2B:
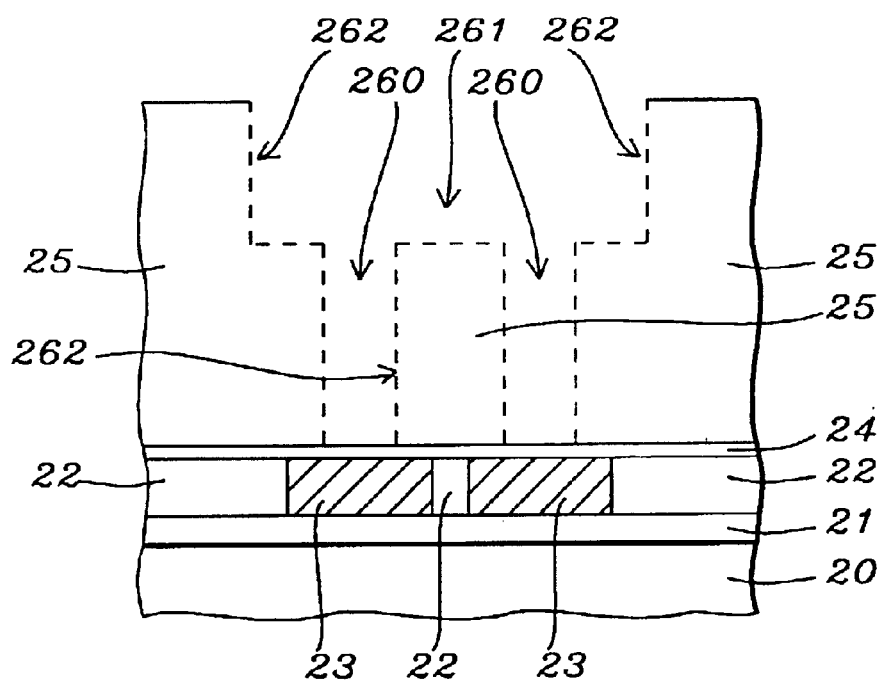

The new and improved method for fabricating dual damascene copper, in which trench/via liner removal from porous low-k dielectric, is performed using a new etch chemistry of $CF_4/H_2$, to etch SiN and SiC liners, which are used as dual damascene etch stops, will now be described in detail. Process details are: $CF_4/H_2$ based with approximate gas flow ratios of greater than 10 to 1, hydrogen to carbon tetra-fluoride. A nominal gas flow ratio of 300 to 20, hydrogen gas to carbon tetra-fluoride gas, which reduces to a ratio of 15 to 1, was developed.

Prior to this new process, convention liner etching, which is the removal of the etch stops, produced the following deleterious results, as shown in FIG. 1, Prior Art: a) Cu re-deposition by sputtering, b) polymer deposits, and c) surface roughening (80) of the porous low-k IMD dielectric, interlevel metal dielectric (6), as shown in FIG. 1. This surface roughening 80 leads to difficulties in subsequent barrier layer deposition for copper dual damascene processing. Referring again to FIG. 1, which in cross-sectional representation illustrates the method of Prior Art, "conventional" dual damascene processing. Provided is a semiconductor substrate 1 with a first insulating layer 2 over the substrate 1, followed by a patterned copper interconnection wiring 4 over the first insulating layer 2. This patterned copper interconnection wiring 4 is embedded in the second insulating layer 3. Next, an etch stop layer 5 is deposited over the second insulating layer 3 and over the copper interconnection wiring 4. This etch stop layer 5 is also referred to a trench/via liner. The etch stop layer 5 or trench/via liner is needed and used to stop the etching process in trench/via formation and protects the underlying copper interconnection wiring 4. The etch stop layer 5 or trench/via liner consists of SiN or SiC. Next, a third insulating layer 6, is formed over the etch stop layer 5, and a trench opening 81 and via openings 80 are formed in the third insulating layer 6. In addition, the third insulating layer 6, is comprised of a low dielectric constant, porous material, and forms an IMD dielectric, interlevel metal dielectric (6). Finally, a layer of photoresist 7 is formed over the third insulating layer 6, so as to expose trench opening 81, via openings 80 and etch stop 5 regions, to a conventional, Prior Art etch, to remove the exposed etch stop layer 5, or trench/via liner and thereby exposed the underlying copper interconnection wiring 4. Prior Art etching processes for removal of the exposed etch stop layer 5, or trench/via liner include the following RIE, reactive ion etch gas chemistries: $CF_4/N_2$+Ar, $CF_4/O_2$+Ar, $CHF_3$+Ar, pure $CHF_3$ without Ar. However, there exist deleterious effects with the Prior Art etch processes above, which include: (a) too much etching, or too "cleanly" etched, yielding surface roughness (90) on the surface of the third insulating layer (6), (b) too little etching, or too "dirty" an etch, yielding too much polymer residue on the copper interconnection wiring 4. Also, Prior Art methods can oxide the copper interconnection wiring 4, during this etch process.

Referring to FIGS. 2A–F which in cross-sectional representation illustrate the method of the present invention, in a dual damascene process. The new and improved method for fabricating dual damascene copper, in which trench/via liner removal from porous low-k dielectric, is performed using a new etch chemistry of $CF_4/H_2$, to etch SiN and SiC liners, which are used as dual damascene etch stops, will now be described in detail. Referring to FIG. 2A, which in cross-sectional representation illustrates the first part of the present invention, in a dual damascene process. Provided is a semiconductor substrate 20 with a first insulating layer 21 over the substrate 20, followed by a patterned copper interconnection wiring 23 over the first insulating layer 21. The semiconductor substrate is comprised of semiconductor device structures such as gate electrodes, source/drain regions therein and multiple levels of metal interconnections. Furthermore, the patterned copper interconnection wiring 23 is embedded a second insulating layer 22. Next, an etch stop layer 24 is deposited over the second insulating layer 22 and over the copper interconnection wiring 23. This etch stop layer 24 is also referred to a trench/via liner. The etch stop layer 24 or trench/via liner is needed and used to stop the etching process in trench/via formation and protects the underlying copper interconnection wiring 23. The etch stop layer 24 or trench/via liner is selected from the group comprised of SiN and SiC, deposited by chemical vapor deposition, in a thickness range from approximately 200 to 800 Angstroms.

Referring to FIG. 2B, which in cross-sectional representation illustrates the next part of the present invention, in a dual damascene process. A third insulating layer 25, is formed over the etch stop layer 24, and subsequent trench opening 261 (arrow) and via openings 260 (arrow) are formed in the third insulating layer 25, as outlined by the dotted lines 262 (arrow). In addition, the third insulating layer 25, is comprised of a low dielectric constant, porous material, and forms an IMD dielectric, interlevel metal dielectric 25.

Figure 2C:
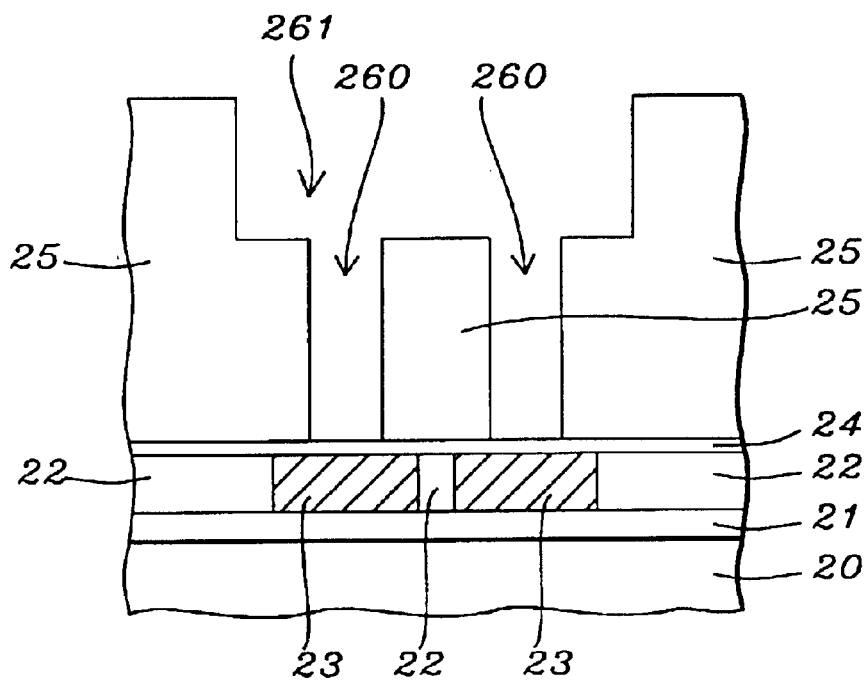

Referring to FIG. 2C, which in cross-sectional representation illustrates the formation of the dual damascene openings, as an integral part of the present invention. Using photoresist masking with provided photolithography processes, there is formed in the third insulating layer 25 and over the etch stop layer 24, trench opening 261 (arrow) and via openings 260 (arrow). The details of the etch process, whereby trench and via openings are formed are as follows: the insulating layer is reactive ion etched by a process chemistry selected from the group of gases comprised of $CF_4$, $CHF_3$, $CH_2F_2$, $C_4F_8$, $C_5F_8$, $C_4F_6$, and is combined with ambient gas mixtures selected from the group comprised of Ar, $O_2$, $N_2$, CO and He, with the etch removal process stopping on the etch stop layer 24.

Figure 2D:
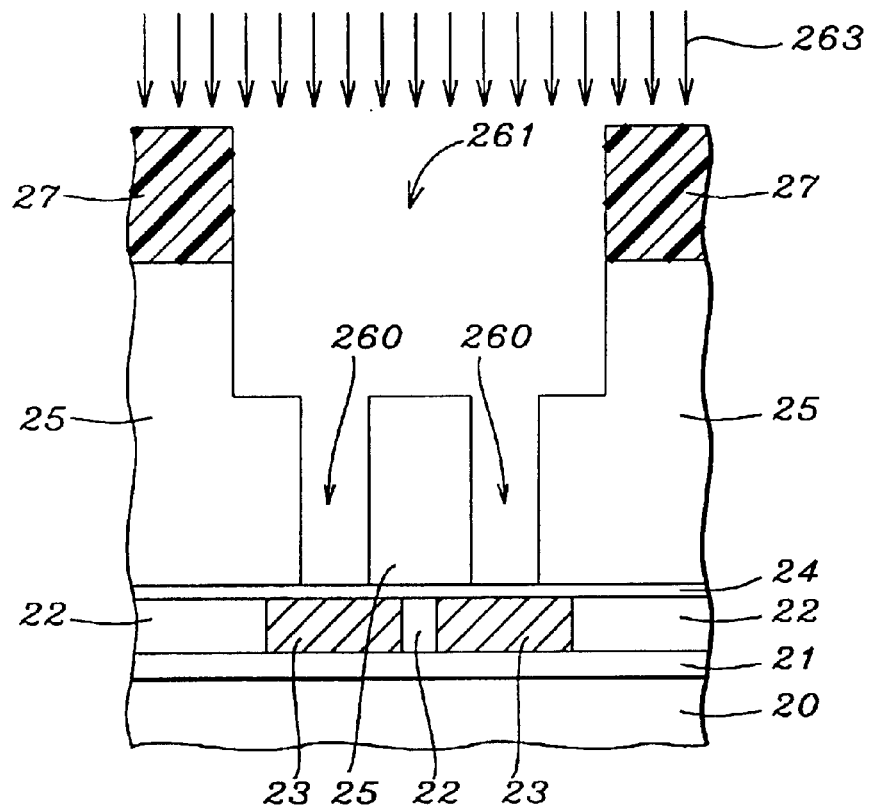

Referring to FIG. 2D, which in cross-sectional representation illustrates the key aspects of the present invention. A layer of photoresist 27 is formed over the third insulating layer 25, so as to expose trench opening 261, via openings 260 and etch stop 24 regions, to the new etchant 263 (arrow) of the present invention, to remove the exposed etch stop layer 24, or trench/via liner, and thereby, exposing the underlying copper interconnection wiring 23. The trench/via liner, or exposed etch stop, is removed from a porous low-k dielectric environment, using a new etch chemistry of $CF_4/H_2$, to etch the SiN and SiC liners, which are used as dual damascene etch stops. Process details are: reactive ion etch in a plasma of $CF_4/H_2$ gases, with approximate gas flow ratios of greater than 10 to 1, hydrogen to carbon tetra-fluoride. A nominal gas flow ratio of 300 to 20, hydrogen gas to carbon tetra-fluoride gas, which reduces to a ratio of 15 to 1, was developed. The $CF_4/H_2$ based, RIE, reactive ion etch process 263 (arrow) yields good etch stop removal, in a reducing atmosphere with HF generation, with smooth shiny copper without CuO. The RIE conditions are: power range from 100 to 500 Watts, bias from 50 to 1000 Volts, and temperature from −10 to 200° C. In addition, the process yields smooth intermetal dielectric surfaces, and does not need any subsequent solvent processing steps. The present invention applies to porous low dielectric constant dielectric insulators with dielectric constants less than 2.5 selected from the group comprised of several Japanese company products, JSR: LKD-5109, 2 Dou, Xerogel, Trikon: Orion, and other porous, low dielectric constant insulators, comprised of low dielectric constant porous materials selected from the group comprised of: SiN, SiO, SOG, spun-on-glass, PE plasma enhanced TEOS, tetraethoxysilane, halogenated SiO, and fluorinated silicate glass, the group all deposited by a chemical vapor deposition process or a spin-on process, in a thickness range from 2,000 to 15,000 Angstroms.

Figure 2E:
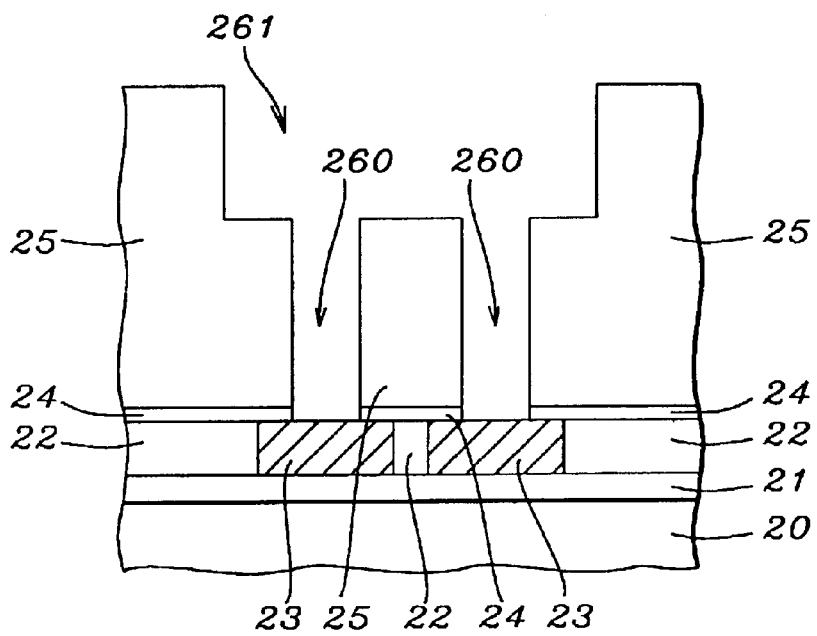

Referring to FIG. 2E, which in cross-sectional representation illustrates some of the final aspects of the present invention. The layer of photoresist is stripped from the third insulating layer, and the trench opening 261 (arrow), via openings 260 (arrow) are shown, for dual damascene processing. The etch stop layer 24 is shown removed by the etching process, in the exposed via openings 260, and the underlying copper interconnection wiring 23 is shown partially exposed to the via openings 260 (arrow).

Figure 2F:
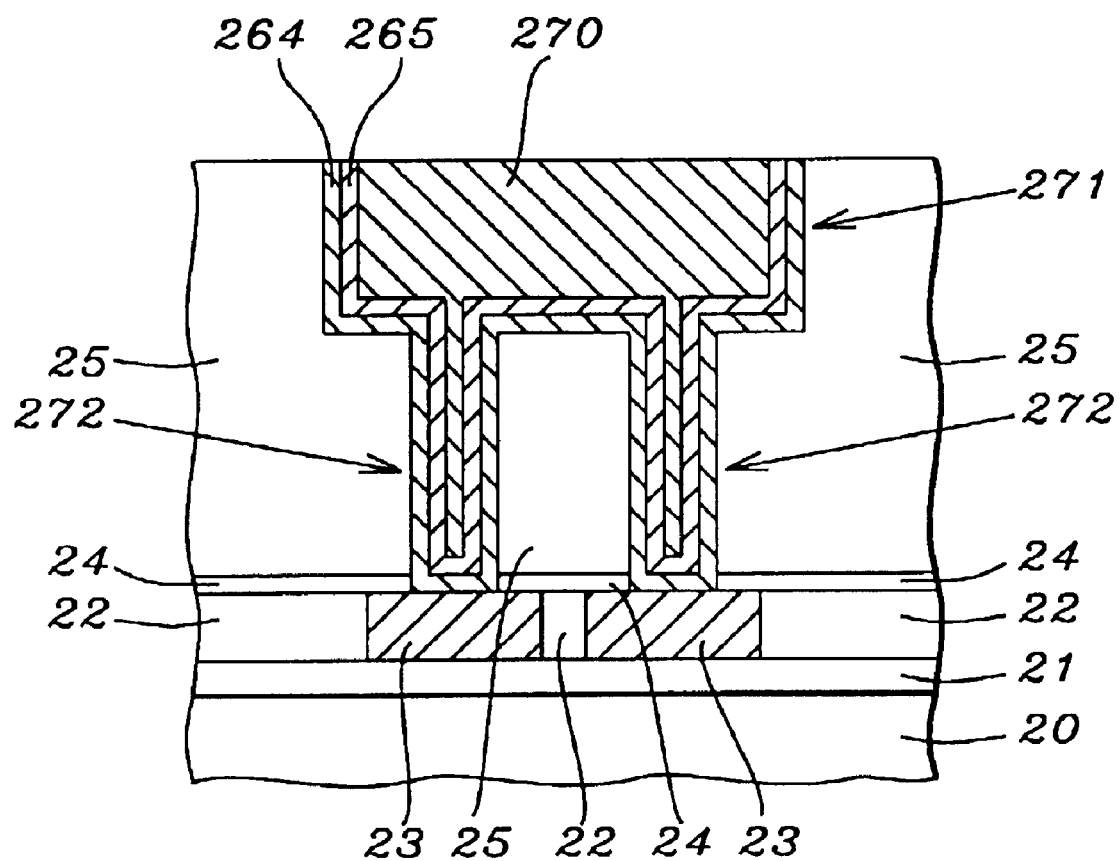

Referring to FIG. 2F, which in cross-sectional representation illustrates the final processing steps of the present invention. Routine dual damascene copper processing follows to complete the inlaid copper interconnection wiring 271 (arrow) and the copper via contacts 272 (arrows), with conducting copper 270 connected to the underlying copper interconnection wiring 23. To form the conducting copper 270, a barrier layer 264 is formed in the trench opening and via openings. The barrier layer 264 is selected from the group comprised of TaN and W, deposited by physical vapor deposition, sputter deposited to an approximate thickness from 20 to 700 Angstroms. Next, a copper seed layer 265 is formed over the barrier layer. The copper seed layer 265 is comprised of copper, deposited by physical vapor deposition, sputter deposited to an approximate thickness from 50 to 2000 Angstroms. Then, copper is electrochemically plated onto the copper seed layer. The electrochemically plated copper on the copper seed layer is comprised of copper deposited by a plating process, using sulfuric acid bath, which fills the trench and via openings with electrochemically plated copper on the copper seed layer, and forms an excess of copper on the surface of the third insulating layer, with a plated copper thickness approximately 2000 to 5000 Angstroms. Finally, the plated copper, copper seed layer and barrier layer are removed from the surface of the third insulating layer 25, and the surface of the third insulating layer 25 is planarized to form inlaid copper interconnect wiring 271 and copper contact vias 272. Multilevel interconnect wiring and contact vias are formed by repeating the above processing steps.

While the invention has been particularly shown and described with reference to the preferred embodiments thereof, it will be understood by those skilled in the art that various changes in form and details may be made without departing from the spirit and scope of the invention.

What is claimed is:

1. A method for fabricating dual damascene trench and vias openings over copper wiring comprising:
   providing a substrate with copper wiring thereon;
   depositing an etch stop layer over the copper wiring, which is SiN or SiC;
   depositing an insulating layer over the etch stop;
   etching dual damascene trench/via openings, in the insulating layer exposing regions of the etch stop;
   forming etch protected regions on the insulating layer, while exposing trench/via openings and portions of the etch stop layer in the trench/via openings;
   etching away the exposed portions of the etch stop layer, in a plasma containing reactive gases of hydrogen and carbon tetra-fluoride using a bias voltage, thus exposing the underlying copper wiring.

2. The method of claim 1, wherein said semiconductor substrate is comprised of semiconductor device structures, gate electrodes and source/drain regions.

3. The method of claim 1, wherein said semiconductor substrate is comprised of semiconductor device structures, gate electrodes, source/drain regions and multiple levels of metal interconnections.

4. The method of claim 1, wherein said insulating layer is a porous, low dielectric constant material or materials with dielectric constants less than 2.5 selected from the group comprised of SiN, SiO, SOG, which is spun-on-glass, PE plasma enhanced TEOS, which is tetraethoxysilane, halogenated SiO, and fluorinated silicate glass, all deposited by a chemical vapor deposition process or a spin-on process, in a thickness range from 2,000 to 15,000 Angstroms.

5. The method of claim 1, wherein said etch stop layer is selected from the group comprised of SiN and SiC, deposited by chemical vapor deposition, in a thickness range from approximately 200 to 800 Angstroms.

6. The method of claim 1, whereby trench and via openings are formed by etching the insulating layer by the following reactive ion etch process chemistry selected from the group of gases comprised of $CF_4$, $CHF_3$, $CH_2F_2$, $C_4F_8$, $C_5F_8$, $C_4F_6$, combined with ambient gas mixtures selected from the group comprised of Ar, $O_2$, $N_2$, CO and He, stopping the etch removal process on the etch stop layer.

7. The method of claim 1, wherein the exposed portions of the etch stop layer are etched away exposing the underlying copper wiring by a reactive ion etch process comprised of following etchant chemistry and conditions: gaseous mixtures of $CF_4$ and $H_2$ reactive gases in a plasma with approximate gas flow ratios of greater than 10 to 1, hydrogen to carbon tetra-fluoride, and with a nominal gas flow ratio of 300 to 20, hydrogen gas to carbon tetra-fluoride gas, which reduces to a ratio of 15 to 1, and with power range from 100 to 500 Watts, bias from 50 to 1000 Volts, and temperature from −10 to 200° C.

* * * * *